(12) United States Patent
Virutchapunt et al.

(10) Patent No.: US 8,080,897 B1
(45) Date of Patent: Dec. 20, 2011

(54) OPTIMAL SENSE LOCATION

(75) Inventors: Tanit Virutchapunt, North Hills, CA (US); Yuan Peng, Sshanghai (CN); Tiansheng Liu, Shanghai (CN)

(73) Assignee: Sigrity, Inc., Santa Clara, CA (US)

( * ) Notice: Subject to any disclaimer, the term of this patent is extended or adjusted under 35 U.S.C. 154(b) by 164 days.

(21) Appl. No.: 12/468,807

(22) Filed: May 19, 2009

(51) Int. Cl.
*H02J 1/00* (2006.01)

(52) U.S. Cl. .......................................... 307/31

(58) Field of Classification Search ............... 307/31, 307/39
See application file for complete search history.

(56) References Cited

U.S. PATENT DOCUMENTS

| | | | |
|---|---|---|---|
| 5,952,733 A * | 9/1999 | Johnston | 307/44 |
| 7,102,338 B2 * | 9/2006 | Osburn et al. | 323/284 |
| 7,397,228 B2 * | 7/2008 | Barrows et al. | 323/282 |
| 7,619,398 B2 * | 11/2009 | Barrows et al. | 323/282 |
| 7,622,824 B2 * | 11/2009 | Orr et al. | 307/69 |
| 7,915,758 B2 * | 3/2011 | Ho et al. | 307/32 |
| 2008/0197714 A1 * | 8/2008 | Verdeyen et al. | 307/107 |
| 2010/0052422 A1 * | 3/2010 | Ho et al. | 307/39 |

* cited by examiner

*Primary Examiner* — Jared Fureman
*Assistant Examiner* — Adi Amrany
(74) *Attorney, Agent, or Firm* — Mark J. Danielson; Pillsbury Winthrop Shaw Pittman LLP (57) ABSTRACT

Optimal feedback sensing locations are determined based on minimizing the sum of the differences between actual voltages and nominal voltages at the devices being supplied by the voltage regulator. An optimal sense location may be determined to be a location (for example, on a PCB or PKG) where the sensed voltage is equal to the nominal voltage of the multiple devices when the voltage output of the power source(s) is equal to a level that minimizes the sum of the differences between the actual voltages and nominal voltages at the devices being supplied by the power source(s). An optimal sense location may also be determined to be a location where the sensed voltage is equal to the average of the voltages at the devices that are supplied by the power source(s). Visual data is generated, the visual data indicating an area or areas that comprise optimal sense locations and locations that are optimal within a preset tolerance range.

21 Claims, 6 Drawing Sheets

OPTIMAL SENSE LOCATION

FIELD OF THE INVENTION

The present invention is related to the field of voltage regulation, and more particularly, to feedback sensing locations for a DC power source.

BACKGROUND OF THE INVENTION

A power source on an electronic product can be an AC-to-DC power supply or a DC-to-DC regulator. The AC-to-DC power supply is designed to supply a steady voltage to loads, and the DC-to-DC regulator may be used to supply a steady voltage that differs from the voltage supplied from the power supply. The power source may also have remote sensing capability that allows it to output a supply voltage based on a sensed voltage that is provided to the power source in a feedback loop.

For example, a power source provides a nominal supply voltage of 1.5V to a microprocessor device on a printed circuit board (PCB). The microprocessor device should also experience a nominal voltage of 1.5V. The voltage at the microprocessor device, however, is sensed to be only 1.4V. This means that there is a voltage drop of 0.1V from the power source to the microprocessor device. If the power source has a remote sensing capability and senses the voltage at the microprocessor device, a sensed voltage of 1.4V is fed back to the power source. To compensate for the voltage drop of 0.1V, the voltage regulator outputs a supply voltage of 1.6V. As the voltage level at the microprocessor device fluctuates, the power source adjusts the outputted supply voltage accordingly.

When a power source supplies a single device, the voltage fed back to the voltage regulator is usually sensed at the location of the single device. For example, if the single device is a microprocessor, the sense location would be at the microprocessor.

As systems become more complex, however, a single power source is often used to supply multiple devices. With multiple devices, it is difficult to ascertain an optimal sense location that will enable the power source to output a supply voltage that achieves the best compromise between the voltage needs of the multiple devices. In some cases, there may also be multiple power sources that supply voltages to the multiple devices. Currently, designers of PCBs determine sense locations by guessing a sense location based on experience and the current consumptions of the devices supplied by a power source or power sources. This often results in sub-optimal sense locations and power sources supplying voltages that are too high or too low.

Thus, there is a need for a better way to determine an optimal sense location for sensing the feedback voltage to a power source so that the supplied devices are supplied with voltages close to nominal voltages.

SUMMARY OF THE INVENTION

The present invention is related to the field of voltage regulation, and more particularly, to feedback sensing locations for a power source. Optimal feedback sensing locations are determined based on minimizing the differences between actual voltages and nominal voltage(s) at the devices being supplied by the power source.

According to one aspect of the present invention, an optimal sense location is determined to be a location (for example, on a PCB) where the voltage output of the power source(s) is equal to a level that minimizes the sum of the differences between the actual voltages and nominal voltages at the devices being supplied by the power source(s).

According to another aspect of the present invention, an optimal sense location is determined to be a location (for example, on a PCB) where the sensed voltage is equal to the average of the voltages at the devices that are supplied by the power source. According to another aspect of the present invention, an optimal sense location is automatically determined through computational methods and circuit simulations.

In furtherance of these and other aspects, an area or areas that comprise optimal sense locations and locations that are optimal within a tolerance range are automatically determined.

In additional furtherance of the above and other aspects, visual data is generated, the visual data indicating an area or areas that comprise optimal sense locations and locations that are optimal within a preset tolerance range.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE PREFERRED EMBODIMENTS

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the invention is intended to encompass other embodiments including a plurality of the same component, and vice-versa, unless explicitly stated otherwise herein.

Moreover, applicants do not intend for any term in the specification or claims to be ascribed an uncommon or special meaning unless explicitly set forth as such. Further, the present invention encompasses present and future known equivalents to the known components referred to herein by way of illustration.

Figure 1:
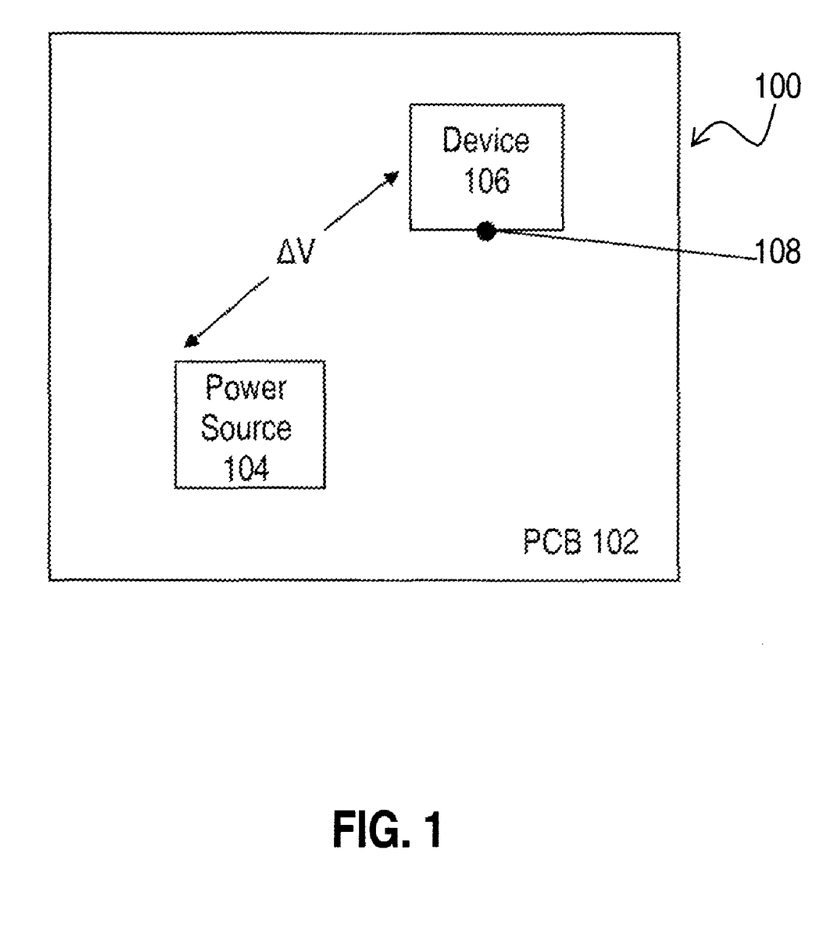
FIG. 1 is a top down view of a system comprising a power source and a device supplied by the power source.

In FIG. 1, a top down view of system 100 is depicted. System 100 includes a printed circuit board (PCB) 102, on which power source 104 and device 106 are mounted. As used herein, a power source performs voltage regulating function and may also be referred to as a voltage regulator module (VRM), and a device is any integrated circuit (IC) device, such as a microprocessor. Although embodiments of the invention described herein refer to devices on a PCB, in other embodiments of the invention optimal sense locations may be determined for use with other apparatuses besides a PCB. For example, a system-on-a-chip (SOC) device may contain various modules within the chip that are supplied with power from internal or external power source(s). In an embodiment of the invention, an optimal sense location within the SOC device for sensing voltages that are fed back to the internal or external power source(s) may be determined. In another example, a single package may contain multiple chips or chip modules that are supplied with power from internal or external power source(s). In an embodiment of the invention, an optimal sense location within the package for sensing voltages that are fed back to the internal or external power source(s) may be determined.

In system 100, power source 104 controls and outputs a supply voltage that is received by device 106. The voltage actually received by device 106, however, is not the same as the supply voltage output by power 104 due to the voltage, or IR, drop from power source 104 to device 106. That is:

$$V_{device} = V_{supply} - \Delta V$$

where $V_{device}$ is the voltage at device 106, $V_{supply}$ is the output voltage of power source 104, and $\Delta V$ is the voltage drop from power source 104 to device 106.

A voltage is sensed at sense location 108, which is chosen to be at device 106 so that:

$$V_{sense} = V_{device}$$

where $V_{sense}$ is the voltage sensed at sense location 108. $V_{sense}$ is provided to power source 104 in a feedback loop, and power source 104 adjusts the supply voltage to compensate for the $\Delta V$ from the location of power source 104 to the location of device 106:

$$V_{supply} = V_{nominal} + \Delta V = V_{nominal} + (V_{nominal} - V_{sense})$$

Since $$V_{supply} = V_{nominal} + \Delta V$$

and $$V_{device} = V_{supply} - \Delta V$$

this results in:

$$V_{device} = V_{nominal} + \Delta V - \Delta V = V_{nominal}$$

where $V_{supply}$ is the supply voltage output by the power source 104, and $V_{nominal}$ is the desired voltage supplied to the device. With $V_{supply}$ now equal to $V_{nominal} + \Delta V$, where $\Delta V$ is the difference between $V_{nominal}$ and the actual voltage at the device (since $V_{sense} = V_{device}$), $V_{device}$ is now equal to $V_{nominal}$. In other words, the actual voltage supplied to and experienced by the device is now equal to the desired voltage supplied to the device.

It should be appreciated that PCBs generally comprise at least one power plane and at least one ground plane, and that the term "voltage" as used herein generally refer to the voltage between a pin or location on the power plane and a pin or location on the ground plane. As such, the term "location" may also refer to a pair of locations, one on the power plane and one on the ground plane.

Figure 2:
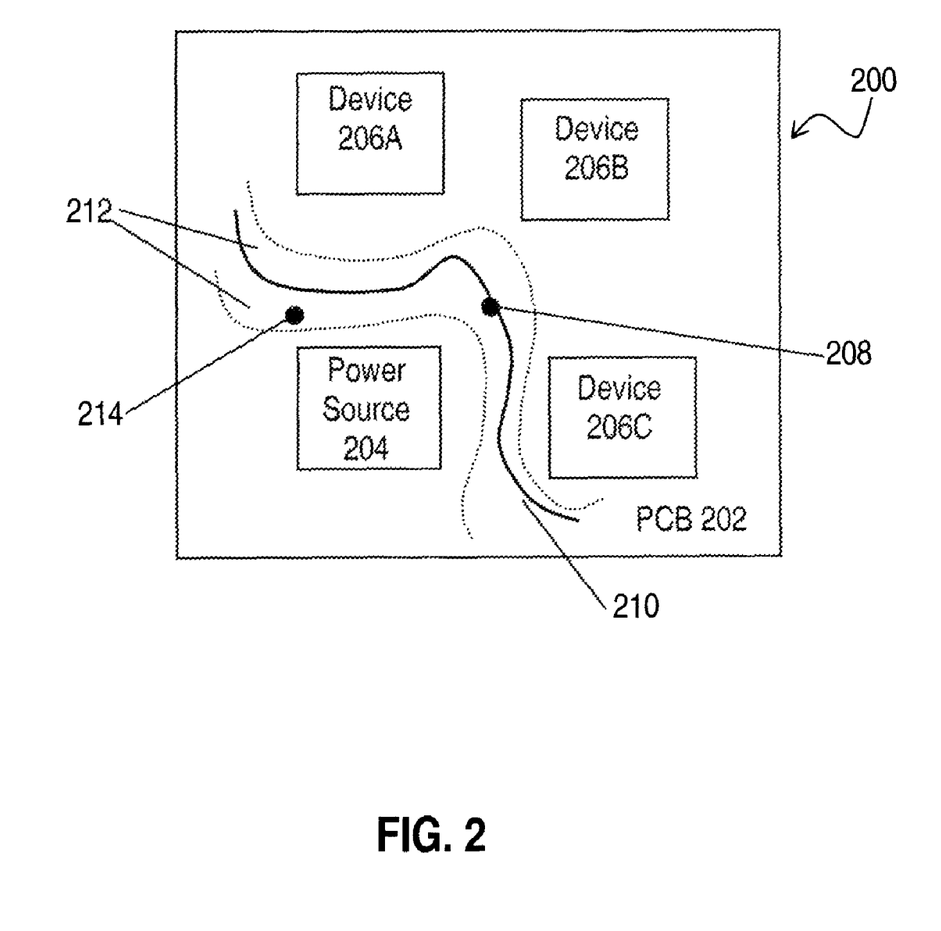
FIG. 2 is a top down view of a system comprising a power source and multiple devices supplied by the power source.

Referring to FIG. 2, a top view of system 200 is depicted. System 200 includes a PCB 202, on which power source 204 and devices 206A, 206B, and 206C are mounted. Power source 204 controls and outputs a supply voltage that is received by devices 206A, 206B, and 206C. Each of the devices 206A, 206B, and 206C may actually receive a different voltage due to different voltage drops from power source 204. Although the example depicted in FIG. 2 illustrates one power source (i.e. power source 204) and three devices (devices 206A, 206B, and 206C), it should be appreciated that the present invention is not limited to any particular number or configuration of power sources and devices.

On PCB 202, the voltage sensed at sense location 208 feeds back to power source 204. Power source 204 operates to output a supply voltage that results in a voltage equal to the nominal voltage of power source 204 at sense location 208 by compensating for the voltage drop between power source 204 and sense location 208, substantially as described with respect to the example in FIG. 1.

According to an aspect of the present invention, an optimal sense location is determined for sense location 208 such that the differences between actual voltages and nominal voltages at the devices being supplied by the power source is minimized. Mathematically, the sum of the differences may be represented as:

$$\sum_{m=0}^{M-1} |VS_m - V_{nml}|$$

where $VS_m$ is the actual voltage of the mth device (e.g., devices 206A, 206B, and 206C), m=0, . . . M−1; M is the number of devices (e.g., three in the example in FIG. 2); and $V_{nml}$ is the nominal voltage that should be experienced at the devices.

Equation (1) below is an equation that simplifies the representation of minimizing the differences between actual voltages and nominal voltages. Equation (1) may be used as an object function F that is to be minimized:

$$F = \sum_{m=0}^{M-1} (VS_m - V_{nml})^2 \quad (1)$$

According to one aspect of the present invention, an optimal sense location is determined to be a location (for example, on a PCB) where the voltage output of the power source(s) is equal to a level that minimizes the differences between the actual voltages and nominal voltages at the devices being supplied by the power source(s). It should be appreciated by a person of ordinary skill in the art that other equations besides Equation (1) may be utilized in other embodiments of the present invention to achieve the goal of minimizing the differences between a nominal voltage and actual voltages. For example, other equations may be:

$$F = \sum_{m=0}^{M-1} (VS_m - V_{nml})^3 \quad (1.1)$$

or $$F = \sum_{m=0}^{M-1} (VS_m - V_{nml})^4 \quad (1.2)$$

First, the voltage level of the voltage power source(s) that minimizes the differences between the actual voltages and nominal voltages at the devices being supplied by the power source(s) is determined. For linear circuits, equation (1) may be written as:

$$VS_m = \sum_{n=0}^{N-1} K_{m,n} VM_n + C_m, \quad m = 0, \ldots, M-1 \quad (2)$$

where $VM_n$ is the voltage of the nth power source, n=0, ... N−1;

N is the number of power source(s);

$C_m$ is the total contribution of all the devices to the voltage of the mth device, m=0, ... M−1; and $K_{m,n}$ is the linear relationship between the voltage of the mth device and the output voltage of the nth power source, m=0, ... M−1, n=0, ... N−1.

$C_m$ is the voltage at the mth device if the power source(s) are replaced with a short circuit. $K_{m,n}$ may be determined by taking the devices out of consideration (i.e., considering each device to be an open circuit). In the case where there is no connection between a power plane and a ground plane other than the devices and the power source(s), $K_{m,n}$ is equal to 1. In the case where there is at least one connection between a power plane and a ground plane besides the devices and the power source(s), $K_{m,n}$ is equal to $VS_m/VM_n$.

Combining equations (1) and (2), we get:

$$F(VM_0, \ldots VM_n, \ldots VM_{N-1}) = \sum_{m=0}^{M-1} \left( \left( \sum_{n=0}^{N-1} K_{m,n} VM_n + C_m \right) - V_{nml} \right)^2 \quad (3)$$

With multiple power sources, a designer may specify the contribution of the power sources by using ratios of currents:

$$I_{v0} : \ldots : I_{vn} : \ldots : I_{v(N-1)} = r_0 : \ldots : r_n : \ldots : r_{N-1} \quad (4)$$

where $I_{vn}$ is the actual current supplied by the nth VRM, n=0, ... N−1; and $r_n$ is the ratio of the currents contributed by the nth VRM, n=0, ... N−1. Equation (4) may be treated as a constraint in determining an optimal voltage or voltages for the VRM(s) in a system.

To minimize equation (3), a solution may be found by solving the following equations:

$$\begin{cases} \dfrac{\partial F(VM_0, \ldots VM_n, \ldots VM_{N-1})}{dVM_0} = 0 \\ \ldots \\ \dfrac{\partial F(VM_0, \ldots VM_n, \ldots VM_{N-1})}{dVM_n} = 0 \quad , n = 0, \ldots N-1 \\ \ldots \\ \dfrac{\partial F(VM_0, \ldots VM_n, \ldots VM_{N-1})}{dVM_{N-1}} = 0 \\ I_{v0} : \ldots : I_{vn} : \ldots : I_{v(N-1)} = r_0 : \ldots : r_n : \ldots : r_{N-1} \end{cases} \quad (5)$$

The solution of equation (5) is a voltage value for each power source in the system. The solution voltage values, or the optimal output voltage values, are then used as the output voltages of the power source(s) in the system. When there are two or more power source(s), there may be a different optimal output voltage value for each power source.

It should also be apparent that multiple devices may have different desired nominal voltages. Although the examples discussed herein involve only a single nominal voltage for all the devices, optimal sense locations may be determined for systems with different nominal voltages for different devices in other embodiments of the present invention.

Next, using the optimal voltage value(s) as the output voltage value(s) of the power source(s) in the system, the voltage distribution of the nodes in the system are calculated. For example, on a PCB, the voltages of the nodes on the power plane and the voltages of the nodes on the ground plane are calculated. Then, node pairs formed from a node in the power plane and a node from the ground plane are selected. A node pair may be denoted $(N_p, N_n)$, where $N_p$ is the node belonging to the power plane and $N_n$ is the node belonging to ground plane. The selected node pairs are node pairs in which the voltage difference between the power plane node $N_p$ and the ground plane node $N_n$ is equal to the nominal voltage $V_{nml}$. The selected node pair(s) are determined to be the optimal sense locations.

In the case that there is no node pair in which the voltage difference between the power plane node $N_p$ and the ground plane node $N_n$ is equal to the nominal voltage $V_{nml}$, the node pair or node pairs in which the voltage differences are the closest to the nominal voltage may be selected as the optimal sense location(s).

Because it may not always be feasible to place sense pins at the optimal sense locations, it is helpful to determine and provide to designers the sense locations that are good sense locations. Good sense locations are locations where the voltage difference between the nodes in the node pair are close to the nominal voltage $V_{nml}$, even though the voltage difference is not exactly equal to $V_{nml}$. Designers may also specify a tolerance range to indicate a tolerance for the deviation in voltage difference from $V_{nml}$ that is still acceptable for a node pair. Therefore, according to one embodiment, the selected node pair(s) are node pairs in which the voltage difference between the power plane node $N_p$ and the ground plane node $N_n$ is equal to the nominal voltage $V_{nml}$ within a preset tolerance range that may be specified by the designer. That is, node pairs which the voltage difference between the power plane node $N_p$ and the ground plane node $N_n$ is greater than $V_{nml}$−tolerance and less than $V_{nml}$+tolerance are determined to be good sense locations and may be provided to designers to assist the designers in the placement of sense pins.

In furtherance of this aspect of the invention, nodes in the power plane and the ground plane may be sorted in order of voltage values to facilitate the searching of optimal and/or good sense locations. For example, nodes in the power plane and the ground plane may be sorted with the heap sorting or the binary search algorithm. Persons skilled in the art will recognize that other sorting methods may also be used. Once the nodes are sorted, a search algorithm may be employed to determine node pairs that are optimal and/or good sense locations.

Figure 3:
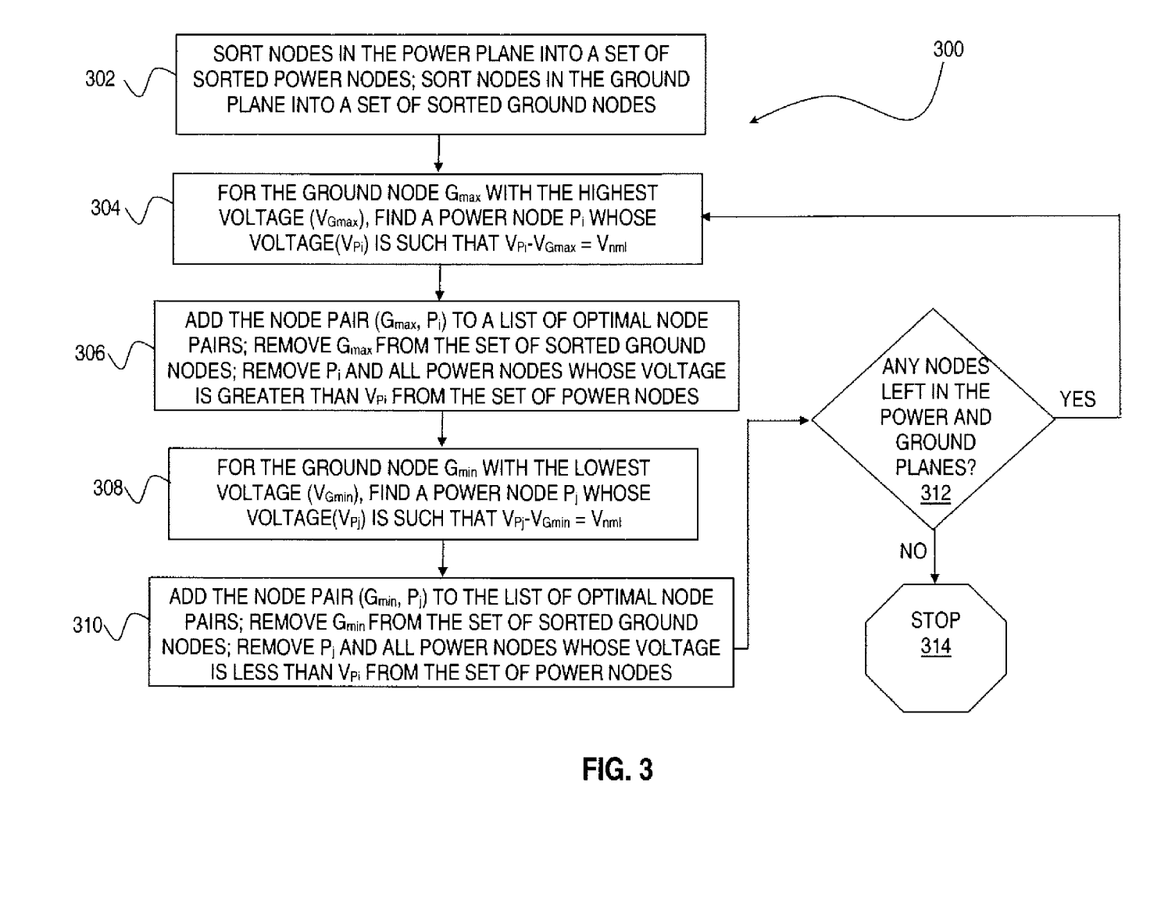
FIG. 3 is a block diagram illustrating search steps in accordance with one aspect of the invention.

FIG. 3 illustrates a flow chart 300 that includes the steps in an exemplary algorithm that finds a set of optimal node pairs. In step 302, nodes in the power plane are sorted by voltage values into a set of sorted power nodes. Also in step 302, nodes in the ground plane are sorted by voltage values into a set of sorted ground nodes. Next, in step 304, for the ground node $G_{max}$ whose voltage, $V_{Gmax}$, is the highest ground node voltage value, a power node $P_i$ is found, where the voltage at power node $P_i$ is $V_{Pi}$, and the difference between $V_{Pi}$ and $V_{Gmax}$ is equal to $V_{nml}$.

In step 306, the node pair $(G_{max}, P_i)$ is added to a list of optimal node pairs. The node $G_{max}$ is removed from the set of sorted ground nodes, and the node $P_i$ is removed from the set of sorted power nodes. In addition, all power nodes whose voltage values are greater than $V_{Pi}$ are removed from the set of power nodes because power nodes whose voltage values are greater than $V_{Pi}$ will not be matched with any ground nodes to form optimal node pairs.

Similar steps for performed in steps 308 and 310 for the ground node $G_{min}$ whose voltage, $V_{Gmin}$, is the lowest ground node voltage value. A power node $P_j$ is found, where the voltage at power node $P_j$ is $V_{Pj}$, and the difference between $V_{Pj}$ and $V_{Gmin}$ is equal to $V_{nml}$ (step 308). Then, the node pair $(G_{min}, P_j)$ is added to a list of optimal node pairs (step 306). The node $G_{min}$ is removed from the set of sorted ground nodes, and the node $P_j$ is removed from the set of sorted power nodes. In addition, all power nodes whose voltage values are less than $V_j$ are removed from the set of power nodes because power nodes whose voltage values are less than $V_{Pj}$ than will not be matched with any ground nodes to form optimal node pairs (step 306).

As long as there are nodes left for consideration (step 312), steps 304, 306, 308, and 310 are repeated with only the nodes that have not been removed from consideration. When all nodes are removed from consideration, the process stops (step 314). At this point, the set of optimal node pairs contains optimal node pairs where the voltage difference between the power node of the node pair and the ground node of the node pair is equal to $V_{nml}$.

Figure 4:
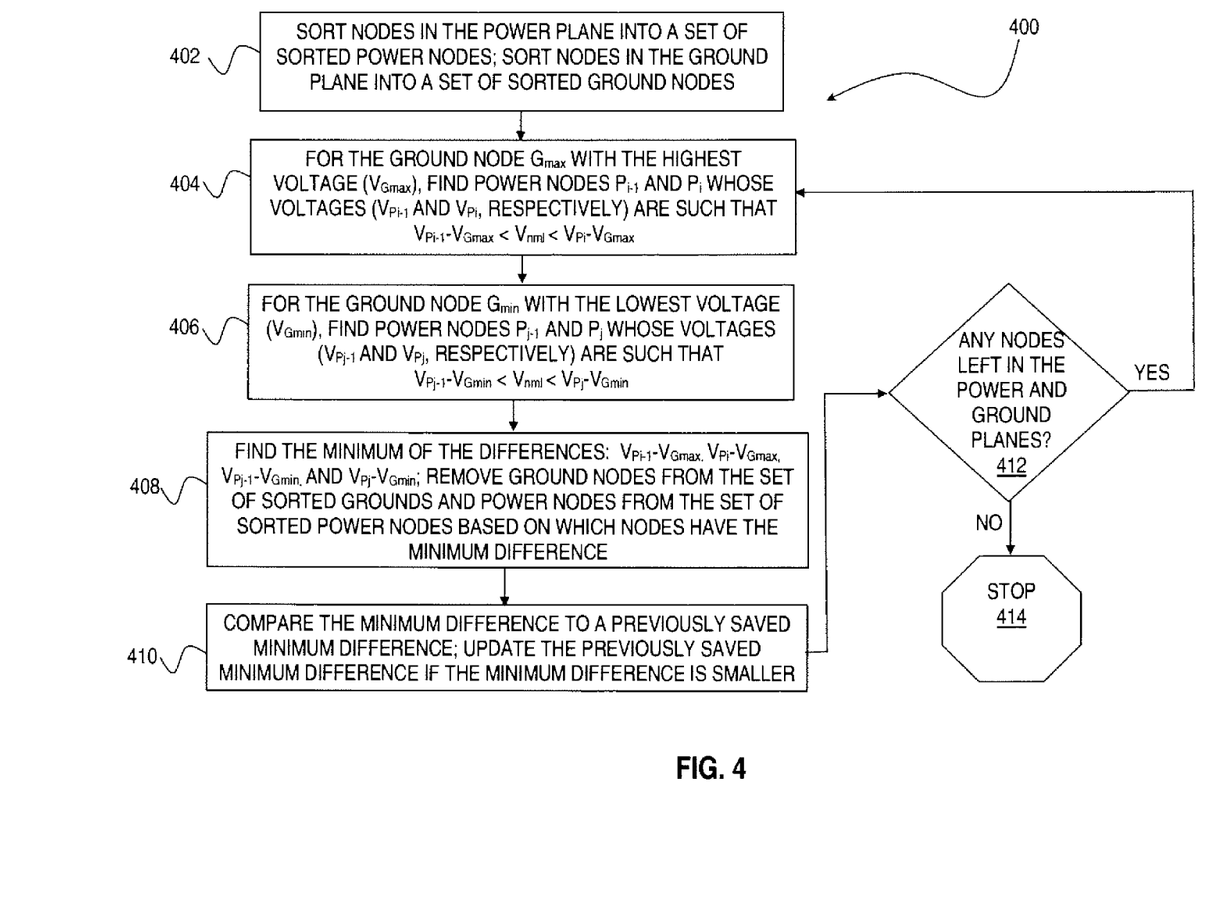
FIG. 4 is a block diagram illustrating search steps in accordance with one aspect of the invention.

Sometimes, designers may be interested in node pairs whose voltage differences are close to, but not exactly equal to, $V_{nml}$. Designers may specify a preset tolerance for the range of acceptable voltage difference deviation from $V_{nml}$. It is useful to determine the minimum achievable tolerance for a particular design. FIG. 4 illustrates a flow chart 400 that includes the steps in an exemplary algorithm that determines the minimum achievable tolerance for a particular design. In step 402, nodes in the power plane are sorted by voltage values into a set of sorted power nodes. Also in step 402, nodes in the ground plane are sorted by voltage values into a set of sorted ground nodes. Next, in step 404, for the ground node $G_{max}$ whose voltage, $V_{Gmax}$, is the highest ground node voltage value, power nodes $P_{i-1}$ and $P_i$ are found, where the voltages at power nodes $P_{i-1}$ and $P_i$ are $V_{Pi-1}$ and $V_{Pi}$, respectively, and $V_{Pi-1}-V_{Gmax}<V_{nml}<V_{Pi}-V_{Gmax}$.

In step 406, for the ground node $G_{min}$ whose voltage, $V_{Gmin}$, is the lowest ground node voltage value, power nodes $P_{j-1}$ and $P_j$ are found, where the voltages at power nodes $P_{j-1}$ and $P_j$ are $V_{Pj-1}$ and $V_{Pj}$, respectively, and $V_{Pj-1}-V_{Gmin}<V_{nml}<V_{Pj}-V_{Gmin}$. Then, in step 408, a node pair from the set of node pairs $\{(G_{max}, P_{i-1}), (G_{min}, P_i), (G_{max}, P_{i-1}), (G_{max}, P_{i-1})\}$ is selected based on the voltage difference between the nodes in each of the node pairs. The selected node pair is the node pair whose voltage difference is the closest to $V_{nml}$. Also in step 408, the nodes $G_{max}$ and $G_{min}$ are removed from the set of sorted ground nodes, and the nodes $P_{i-1}, P_j$, all power nodes whose voltage values are greater than $V_{Pi-1}$, and all power nodes whose voltage values are less than $V_j$ are removed from the set of sorted power nodes.

In step 410, the voltage difference of the selected node pair is compared to a previously saved minimum difference value. If the voltage difference of the selected node pair is less than the previously saved minimum difference value, then the minimum difference value is updated to be the voltage difference of the selected node pair. If the voltage difference of the selected node pair is equal to or more than the previously saved minimum difference value, then the minimum difference value is not changed. It should be apparent that in the first iteration of steps 404, 406, 408, and 410, the initial minimum difference value is not yet set, and the voltage difference of the selected node pair in the first iteration becomes the initial minimum difference value.

As long as there are nodes left for consideration (step 412), steps 404, 406, 408, and 410 are repeated with the nodes that have not been removed from consideration. When all nodes are removed from consideration, the process stops (step 414). At this point, the minimum difference value represents the lowest possible tolerance achievable for the system. This minimum difference value may be provided to the designer. For example, if a designer attempts to specify a preset tolerance value that is lower than the lowest possible achievable tolerance, a notification may be provided to alert the designer that the specified preset tolerance is not achievable.

Sometimes, the nodes in a node pair may be physically located far apart from each other. Designers, however, often wish to locate the nodes for a sense location close to each other. According to one embodiment, the power plane and the ground plane are layered on top of each other, or merged, to determine which areas are contained in both the power plane and the ground plane. This area will be referred to as the overlapping area. Optimal sense locations are searched for only with the overlapping area. In furtherance of this aspect of the invention, the power plane and the ground plane are divided up into grids and only the grids that are in the overlapping area are used in the optimal sense location searching. In addition, each grid may be divided up into finite element mesh (FEM) triangles. The optimal sense location searching searches for power and ground node pairs where the power and ground nodes in the node pair are in the same location. Two nodes are in the same location when they are located within the same finite element mesh (FEM) triangle. The node pairs that satisfy the specified tolerance range requirements and satisfy the location requirements are provided as good sense locations.

According to another aspect of the invention, an optimal location is determined for sense location 208 such that the voltages actually experienced by devices 206A, 206B, and 206C are as close as possible to the devices' nominal voltage. In general, for a power source that provides a supply voltage to two or more devices, an optimal sense location provides a sensed voltage back to the power source such that the power source, in using the sensed voltage to regulate the supply voltage, outputs a supply voltage that results in the actual voltages received at the two or more devices being as close as possible to the devices' nominal voltage.

Mathematically, the object function F may be written as:

$$F(V_s) = \sum_{i}^{N} [(V_{i(+)} - V_{i(-)}) - (V_{sp} - V_{sn})]^2 \qquad (7)$$

where $V_{i(+)}$ is the voltage at the positive pin of the ith device; $V_{i(-)}$ is the voltage at the negative pin of the ith device; $V_{i(+)} - V_{i(-)}$ is the voltage at the ith device; $V_{sp}$ is the voltage at the positive pin of the sense location S; $V_{sn}$ is the voltage at the negative pin of the sense location S; $V_s$ is the voltage of the sense location; and N is the number of devices supplied by the power source. An optimal sense location, S, is a location whose voltage $V_s$ satisfies the following:

$$\frac{\partial F(V_s)}{\partial V_s} = 0 \qquad (8)$$

Solving for $V_s$, $$V_s = \frac{1}{N} \sum_{i}^{N} (V_{i(+)} - V_{i(-)}) \qquad (9)$$

$$V_{sp} - V_{sn} = \frac{1}{N} \sum_{i}^{N} (V_{i(+)} - V_{i(-)}) \qquad (10)$$

In other words, an optimal sense location is a location where the sensed voltage is equal to the average of the voltages at the devices that are supplied by the power source to which the sensed voltage is fed back.

$V_{sp}$, $V_{sn}$, $V_{i(+)}$, and $V_{i(-)}$ in turn can be represented according to the following equations:

$$V_{sp} = \sum_{j=1}^{N} K_{sp} C_j + K_{sp[N+1]} V_{vrm}$$

$$V_{sn} = \sum_{j=1}^{N} K_{Sn} C_j + K_{S[n-1]} V_{vrm}$$

$$V_{i(+)} = \sum_{j=1}^{N} K_{(+)} C_j + K_{(-)[N+1]} V_{vrm}$$

$$V_{i(-)} = \sum_{j=1}^{N} K_{(-)} C_j + K_{(-)[N-1]} V_{vrm}$$

where $V_{vrm}$ is the voltage at the power source, $C_j$ is the current drawn by the jth device, and $K_{mj}$ is the linear relationship between the voltages of a point m and the device j when other devices are removed and the power source is considered to be a short circuit. By using the equations above, equation (10) can now be rewritten as:

$$V_{vrm} \left\{ [K_{Sp[N+1]} - K_{Sn[N+1]}] - \frac{1}{N} [K_{(+)[N-1]} - K_{(-)[N+1]}] \right\} = \qquad (11)$$

$$\frac{1}{N} \sum_{i=1}^{N} \sum_{j=1}^{N} C_j [K_{(+)} - K_{(-)}] - \left( \sum_{j=1}^{N} K_{Spj} C_j - \sum_{j=1}^{N} K_{Snj} C_j \right)$$

Equation (11) is true when the following two equations are true:

$$[K_{Sp(N+1)} - K_{Sn[N+1]}] - \frac{1}{N} \sum_{j=1}^{N} [K_{(+)[N+1]} - K_{(-)[N+1]}] = 0 \qquad (12)$$

$$\frac{1}{N} \sum_{i=1}^{N} \sum_{j=1}^{N} C_j [K_{(+)} - K_{(-)}] - \left( \sum_{j=1}^{N} K_{Spj} C_j - \sum_{j=1}^{N} K_{Snj} C_j \right) = 0 \qquad (13)$$

In summary, an optimal sense location is a solution for both equation (12) and equation (13).

The solution of equation (12) is a first plurality of pairs of locations, in which the voltage difference between the two voltages at the two locations in each pair of locations is equal to the average voltage of the devices when the power source is enabled and all the devices are disabled. The solution of equation (13) is a second plurality of pairs of locations, in which the voltage difference between the two voltages at the two locations in each pair of locations is equal to the average voltage of the devices when the power source is disabled and all the devices are enabled. The intersection of the solutions of equations (12) and (13) comprises the optimal sense locations.

According to one approach, when the power and ground nets of the PCB are open, the solution of equation (13) alone comprises the optimal sense locations. When power and ground nets are open, there are no electrical or physical connections the power and ground nets aside from the power source and the devices supplied by the power source. In this case, the solution of (12) is trivial, comprising all the nodes of the power and ground nets, and the intersection of the solutions of equations (12) and (13) comprises just the solution of equation (13).

According to an aspect of the present invention, one or more optimal sense locations are automatically determined by solving equations (12) and (13) using computational and simulation tool and algorithms. For example, $K_{mj}$ can be derived from employing numerical computational methods such as the finite elements method and the finite differences method. One skilled in the art would understand how to derive the solutions for equations (12) and (13) by using these and other computational methods, along with circuit simulation tools and algorithms.

In one approach, one or more good sense locations are determined, where the one or more good sense locations satisfy equations (12) and (13) within a preset tolerance range. It is useful to determine where the good sense locations are because it may not always be feasible to place sense pins at the optimal sense locations. For example, in FIG. 2, an optimal sense location is location 208. Additionally, there may be other optimal sense locations on PCB 202. In general, the intersection of the solutions to equations (12) and (13) is a line, such as line 210. Locations on line 210, such as location 208 are optimal sense locations, However, it may not be feasible to place a sense pin on line 210. If equations (12) and (13) are solved with a preset tolerance range, however, the intersection of the solutions will be expanded beyond line 210 to include other locations that are nearly optimal.

In the example in FIG. 2, area 212 represents an intersection of the solutions to equations (12) and (13) when solved with a tolerance range. Location 214 within area 212, for example, is a nearly optimal, or good, sense location that would be a good place to place a sense pin. Even though location 214 is less optimal than location 208, a designer who cannot physically place a sense pin at location 208 (or somewhere on line 210) can nonetheless achieve a near optimal solution by placing the sense pin at location 214 (or anywhere else within area 212).

According to one approach for computing optimal sense locations for a particular PCB design that includes a power source and a plurality of devices supplied a voltage by the power source, the average voltages of the device's positive pins and negative pins, $V_{ap}$ and $V_{an}$, respectively, are computed. Next, two groups of nodes are determined, each node in the first group denoted node A and each node in the second group denoted node B, where the voltages at nodes A and B, $V_{nodeA}$ and $V_{nodeB}$, satisfy the following equations:

$$V_{ap}-t<V_{nodeA}<V_{ap}+t \qquad (14)$$

$$V_{an}-t<V_{nodeB}<V_{an}+t \qquad (15)$$

where t is a preset tolerance range.

A simulation is run for the particular PCB design, the simulation's results comprising two sets of results: a first set of results generated for the case where the devices are disabled and the power source is enabled, and a second set of results generated for the case where the devices are enabled and the power source is disabled. As used herein, a simulation includes any and all tools, software, computational methods, and algorithms that predict circuit behavior such as voltages, currents, transients, steady-states, etc.

Based on the first set of results, the average voltage of the positive and negative pins of the devices, $V_{ap1}$ and $V_{an1}$, are computed. Then, a first subgroup of nodes comprising nodes A and B that satisfy the following equation are determined.

$$V_{nodeA}-V_{nodeB}=V_{ap1}-V_{an1} \qquad (16)$$

Based on the second set of results, the average voltage of the positive and negative pins of the devices, $V_{ap2}$ and $V_{an2}$, are computed. Then, a subgroup of nodes comprising nodes A and B that satisfy the following equation are determined.

$$V_{nodeA}-V_{nodeB}=V_{ap2}-V_{an2} \qquad (17)$$

The nodes common to both the first subgroup and the second subgroup are determined to be optimal sense locations. Specifically, a pair of nodes consisting of a node A and a node B, both of which belonging to both the first subgroup and the second subgroup, can be determined to be a pair of optimal sense pins.

In the case that the power and ground nets are open, the process for computing optimal sense locations just described above may be simplified by using equation (17) only, resulting in:

$$V_{ap2}=V_{ap} \text{ and } V_{an2}=V_{an} \qquad (18)$$

$$V_{nodeA}-V_{nodeB}=V_{ap}-V_{an} \qquad (19)$$

Additionally, a user may select a particular node A, and a node B can be automatically determined to pair with the selected node A, based on:

$$V_{nodeA\_selected}-V_{nodeB}=V_{ap}-V_{an} \qquad (20)$$

Figure 5:
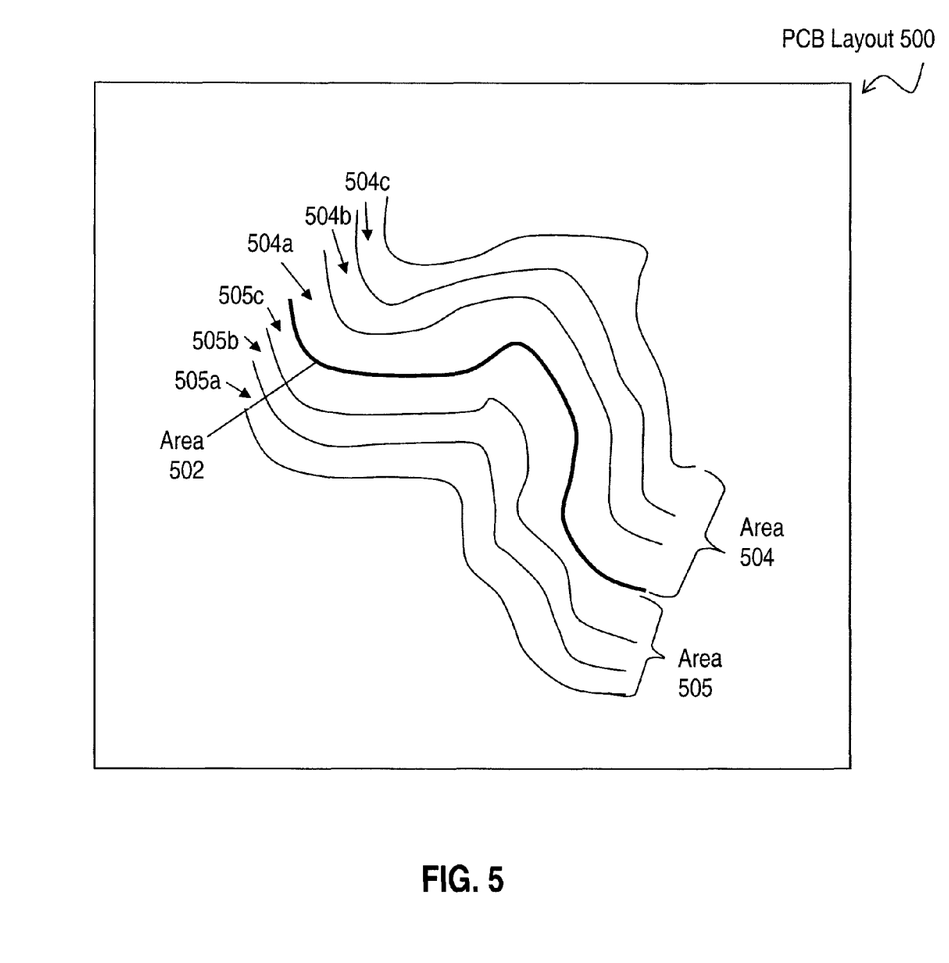
FIG. 5 illustrates an exemplary visual depiction of a PCB that includes areas for optimal and good sense locations.

According to another aspect of the present invention, visual data is generated, the visual data indicating an area or areas on the PCB or PKG that comprise optimal sense locations and locations that are optimal within a preset tolerance range. For example, FIG. 5 illustrates a display of a PCB layout 500 that displays areas 502, 504 and 505. Area 502 is an area in which locations are optimal sense locations. Areas 504 and 505 are areas in which locations are nearly optimal, or good, sense locations according to a preset positive tolerance range. Areas 502, 504, and 505 may be visually depicted in different colors, one color representing the optimal sense locations, another color representing good sense locations that are at the minimum or maximum tolerance, and different colors representing different degrees of deviation from the optimal sense locations, thereby providing a visual representation of where the optimal and good sense locations are. For example, areas 504*a*, 504*b*, and 504*c* may be progressively less optimal areas and may each be presented in a different color. In one example, area 502 may be green, and areas 504*a*, 504*b*, and 504*c* may be yellow, orange, and red. Similarly, areas 505*a*, 505*b*, and 505*c* may also be presented in different colors to represent different levels of deviation from optimality. Areas 505*a*, 505*b*, and 505*c* may be the same colors as areas 504*a*, 504*b*, and 504*c*, respectively, or may be different colors entirely from the colors of 504*a*, 504*b*, and 504*c*.

Figure 6:
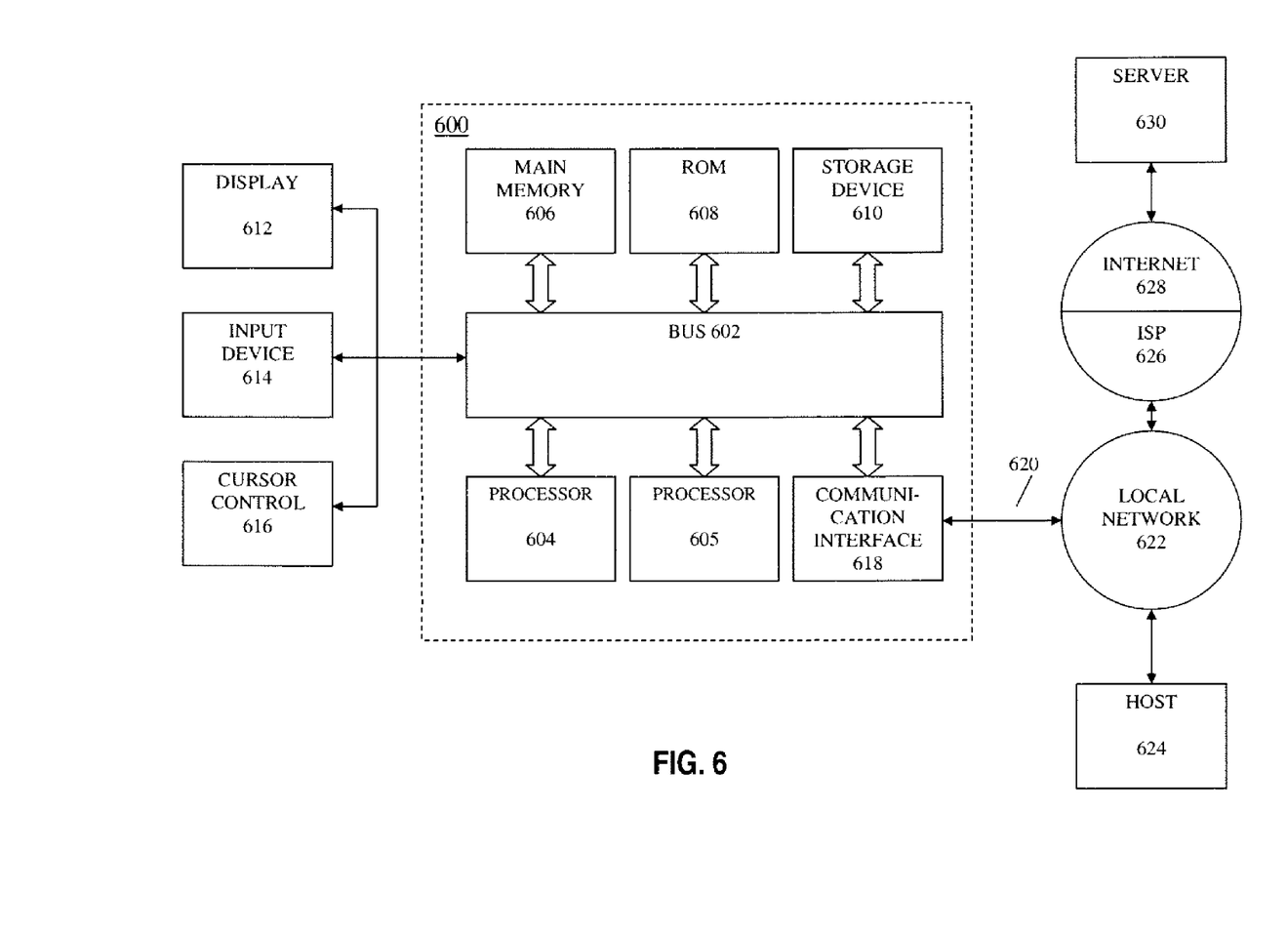
FIG. 6 is a block diagram that illustrates a computer system which can assist in the implementation of the determination of the optimal sense locations of the present invention.

FIG. 6 is a block diagram that illustrates a computer system 600 which can assist in the determining of optimal sense locations, the generation of visual data depicting optimal sense locations, and the display of optimal sense locations, according to the methods disclosed herein. Computer system 600 includes a bus 602 or other communication mechanism for communicating information, and a processor 604 coupled with bus 602 for processing information. Computer system 600 also includes a main memory 606, such as a random access memory (RAM) or other dynamic storage device, coupled to bus 602 for storing information and instructions to be executed by processor 604. Main memory 606 also may be used for storing temporary variables or other intermediate information during execution of instructions to be executed by processor 604. Computer system 600 further includes a read only memory (ROM) 608 or other static storage device coupled to bus 602 for storing static information and instructions for processor 604. A storage device 610, such as a magnetic disk or optical disk, is provided and coupled to bus 602 for storing information and instructions.

Computer system 600 may be coupled via bus 602 to a display 612, such as a cathode ray tube (CRT) or flat panel or touch panel display for displaying information, such as visual information indicating an area or areas on the PCB that comprise optimal sense locations and locations that are optimal within a preset tolerance range, to a computer user. An input device 614, including alphanumeric and other keys, is coupled to bus 602 for communicating information and command selections to processor 604. Another type of user input device is cursor control 616, such as a mouse, a trackball, or cursor direction keys for communicating direction information and command selections to processor 604 and for controlling cursor movement on display 612. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, portions of the process for determining sense locations may be performed by computer system 600 in response to processor 604 executing one or more sequences of one or more instructions contained in main memory 606. Such instructions may be read into main memory 606 from another computer-readable medium, such as storage device 610. Execution of the sequences of instructions contained in main memory 606 causes processor 604 to perform the process steps described herein. One or more processors in a multi-processing arrangement may also be employed to execute the sequences of instructions contained in main memory 606. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 604 for execution. Such a medium may take many forms, including but not limited to, non-volatile media and volatile media. Non-volatile media include, for example, optical or magnetic disks, such as storage device 610. Volatile media include dynamic memory, such as main memory 606. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, or any other medium from which a computer can read.

Various forms of computer readable media may be involved in carrying one or more sequences of one or more instructions to processor 604 for execution. For example, the instructions may initially be borne on a magnetic disk of a remote computer. The remote computer can load the instructions into its dynamic memory and send the instructions over a telephone line using a modem. A modem local to computer system 600 can receive the data on the telephone line and use an infrared transmitter to convert the data to an infrared signal. An infrared detector coupled to bus 602 can receive the data carried in the infrared signal and place the data on bus 602. Bus 602 carries the data to main memory 606, from which processor 604 retrieves and executes the instructions. The instructions received by main memory 606 may optionally be stored on storage device 410 either before or after execution by processor 604.

Computer system 600 also preferably includes a communication interface 618 coupled to bus 602. Communication interface 618 provides a two-way data communication coupling to a network link 620 that is connected to a local network 622. For example, communication interface 618 may be an integrated services digital network (ISDN) card or a modem to provide a data communication connection to a corresponding type of telephone line. As another example, communication interface 618 may be a local area network (LAN) card to provide a data communication connection to a compatible LAN. Wireless links may also be implemented. In any such implementation, communication interface 618 sends and receives electrical, electromagnetic or optical signals that carry digital data streams representing various types of information. Network link 620 typically provides data communication through one or more networks to other data devices. For example, network link 620 may provide a connection through local network 622 to a host computer 624 or to data equipment operated by an Internet Service Provider (ISP) 626. ISP 626 in turn provides data communication services through the worldwide packet data communication network, now commonly referred to as the "Internet" 628. Local network 622 and Internet 628 both use electrical, electromagnetic or optical signals that carry digital data streams.

Computer system 600 can send messages and receive data, including program code, through the network(s), network link 620, and communication interface 618. In the Internet example, a server 630 might transmit a requested code for an application program through Internet 628, ISP 626, local network 622 and communication interface 618. The received code may be executed by processor 604 as it is received, and/or stored in storage device 610, or other non-volatile storage for later execution.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modifications.

What is claimed is:

1. A method comprising:
    identifying a nominal voltage associated with a plurality of devices, the nominal voltage corresponding to a desired voltage value to be provided to the devices; and
    determining at least one sense location for sensing a sensed voltage that feeds back to at least one power source,
    the at least one power source providing a supply voltage to the plurality of devices,
    the at least one power source providing the supply voltage based on the sense voltage;
    the determining of the at least one sense location comprising performing a calculation that includes minimizing the sum of the absolute values of the differences between the nominal voltage and actual voltages at the plurality of devices and identifying the at least one sense location based on a result of the calculation.

2. The method of claim 1, wherein minimizing the sum of the absolute values of the differences between the nominal voltage and actual voltages at the plurality of devices comprises minimizing an object function F, the object function F expressed as:

$$F = \sum_{m=0}^{M-1} (VS_m - V_{nml})^2$$

wherein:
    M denotes a number of devices in the plurality of devices;
    $VS_m$ denotes a voltage at the mth device in the plurality of devices; and
    $V_{nml}$ denotes the nominal voltage of a device in the plurality of devices.

3. The method of claim 2, wherein minimizing the object function F comprises minimizing:

$$F(VM_0, \ldots VM_n, \ldots VM_{N-1}) = \sum_{m=0}^{M-1} \left( \left( \sum_{n=0}^{N-1} K_{m,n} VM_n + C_m \right) - V_{nml} \right)^2$$

wherein:
    N denotes a number of power sources in the at least one power source;
    $VM_n$ denotes a voltage of the nth power source, n=0, . . . N−1;
    $C_m$ denotes a total contribution of devices in the plurality of devices to the voltage of the mth device, m=0, . . . M−1; and
    $K_{m,n}$ denotes a linear relationship between the voltage of the mth device and the output voltage of the nth power source, m=0, . . . M−1, n=0, . . . N−1.

4. The method of claim 3, wherein minimizing the object function F comprises determining, for each power source of the at least one power source, an optimal supply voltage that minimizes the object function F.

5. The method of claim 4, wherein determining at least one sense location comprises determining a sense location at which a sense voltage is equal to the nominal voltages of the devices of the plurality of devices when the at least one power source is outputting the optimal supply voltage that minimizes the object function F.

6. The method of claim 4, wherein the at least one sense location includes a location at which the sensed voltage is within a tolerance range of the nominal voltages of the devices of the plurality of devices when the at least one power source is outputting the optimal supply voltage that minimizes the object function F.

7. The method of claim 2, wherein:
the at least one sense location comprises a first location on a power plane and a second location on a ground plane;
the sensed voltage is a difference between a voltage at the first location and a voltage at the second location.

8. The method of claim 2, further comprising:
generating display data that indicates, on a visual display, the at least one sense location.

9. The method of claim 8, wherein:
the display data includes data for displaying the at least one sense location in color, the color indicating a deviation of the at least one sense location from an optimal location.

10. The method of claim 1, wherein:
the at least one sense location includes a location at which the sensed voltage is equal to the average of device voltages at the plurality of devices.

11. The method of claim 10, wherein the at least one sense location includes a location at which the sensed voltage is within a tolerance range of the averages of the devices voltages at the plurality of devices.

12. The method of claim 10, further comprising:
generating display data that indicates, on a visual display, the at least one sense location.

13. The method of claim 12, wherein:
the display data includes data for displaying the at least one sense location in color, the color indicating a deviation of the at least one sense location from an optimal location.

14. The method of claim 13, wherein:
no devices or components aside from the power source and the plurality of devices connect the power plane and the ground plane;
a device voltage at each device of the plurality of devices comprises a difference between a positive voltage at the each device and a negative voltage at the each device;
determining at least one sense location comprises:
    determining a first group of nodes, each node in the first group of nodes having a voltage within a tolerance range of an average of positive voltages at the devices in the plurality of devices;
    determining a second group of nodes, each node in the second group of nodes having a voltage within a tolerance range of an average of negative voltages at the devices in the plurality of devices;
    determining the at least one sense location to be a pair of nodes comprising a first node from the first group of nodes and a second node from the second group of nodes, a voltage difference between a voltage at the first node and a voltage at the second node equal to the difference between an average of positive voltages at the devices in the plurality of devices when the power source is disabled and the plurality of devices are enabled and an average of negative voltages at the devices in the plurality of devices when the power source is disabled and the plurality of devices are enabled.

15. The method of claim 10, wherein:
the at least one sense location comprises a first location on a power plane and a second location on a ground plane;
the sensed voltage is a difference between a voltage at the first location and a voltage at the second location.

16. The method of claim 15, wherein determining at least one sense location comprises:
determining a first plurality of pairs of locations, wherein each pair of locations comprises two locations, a voltage difference between a voltage at a first location of the two locations and a voltage at a second location of the two locations equal to the average of device voltages at the plurality of devices when the power source is enabled and the plurality of devices are not considered;
determining a second plurality of pairs of locations, wherein each pair of locations comprises two locations, a voltage difference between a voltage at a first location of the two locations and a voltage at a second location of the two locations equal to the average of device voltages at the plurality of devices when the power source is disabled and the plurality of devices are enabled;
determining the at least one sense location to be at least one pair of locations that is common to both the first plurality of pairs of locations and the second plurality of pairs of locations.

17. The method of claim 15, wherein:
no electrical or physical connection exists between the power plane and the ground plane aside from the plurality of devices and the at least one power source; and
determining the at least one sense location to be at least one pair of locations that comprises two locations, a voltage difference between a voltage at a first location of the two locations and a voltage at a second location of the two locations equal to the average of device voltages at the plurality of devices when the power source and the plurality of devices are enabled.

18. The method of claim 15, wherein:
a device voltage at each device of the plurality of devices comprises a difference between a positive voltage at the each device and a negative voltage at the each device;
determining at least one sense location comprises:
    determining a first group of nodes, each node in the first group of nodes having a voltage within a tolerance range of an average of positive voltages at the devices in the plurality of devices;
    determining a second group of nodes, each node in the second group of nodes having a voltage within a tolerance range of an average of negative voltages at the devices in the plurality of devices;
    determining a first group of pairs of nodes, each pair in the first group of nodes comprising a first node from the first group of nodes and a second node from the second group of nodes, a voltage difference between a voltage at the first node and a voltage at the second node equal to the difference between an average of positive voltages at the devices in the plurality of devices when the power source is enabled and the plurality of devices are disabled and an average of negative voltages at the devices in the plurality of devices when the power source is enabled and the plurality of devices are disabled;
    determining a second group of pairs of nodes, each pair in the second group of nodes comprising a first node from the first group of nodes and a second node from the second group of nodes, a voltage difference between a voltage at the first node and a voltage at the second node equal to the difference between an average of positive voltages at the devices in the plurality of devices when the power source is disabled and the plurality of devices are enabled and an average of negative voltages at the devices in the plurality of devices when the power source is disabled and the plurality of devices are enabled;

determining the at least one sense location to be at least one pair of nodes that is common to both the first group of pairs of nodes and the second group of pairs of nodes.

19. A method comprising:
determining at least one sense location for sensing a sensed voltage that feeds back to a power source,
the power source providing a supply voltage to a plurality of devices, and
the power source providing the supply voltage based on the sensed voltage; and
generating display data that indicates, on a visual display, the at least one sense location, wherein the display data includes data for displaying the at least one sense location in color, the color indicating a deviation of the at least one sense location from an optimal sense location within a predetermined tolerance range,
the determining of the at least one sense location comprising:
identifying a nominal voltage associated with the plurality of devices, the nominal voltage corresponding to a desired voltage value to be provided to the devices, and
performing a calculation that includes minimizing the sum of the absolute values of the differences between the nominal voltage and actual voltages at the plurality of devices and identifying the at least one sense location based on a result of the calculation.

20. The method of claim 19, wherein determining at least one sense location comprises determining a sense location at which a sense voltage is equal to the nominal voltage of the devices in the plurality of devices when the at least one power source is outputting an optimal supply voltage that minimizes the object function F, the object function F expressed as:

$$F = \sum_{m=0}^{M-1} (VS_m - V_{nml})^2$$

wherein:
M denotes a number of devices in the plurality of devices;
$VS_m$ denotes a voltage at the mth device in the plurality of devices; and
$V_{nml}$ denotes the nominal voltage of the devices in the plurality of devices.

21. The method of claim 19, wherein the at least one sense location includes a location at which the sensed voltage is equal to the average of device voltages at the plurality of devices.

* * * * *